United States Patent
Nam et al.

(10) Patent No.: US 9,893,307 B2
(45) Date of Patent: Feb. 13, 2018

(54) COMPOSITION FOR ENCAPSULATION OF ORGANIC LIGHT EMITTING DIODE AND ORGANIC LIGHT EMITTING DIODE DISPLAY MANUFACTURED USING THE SAME

(71) Applicant: SAMSUNG SDI CO., LTD., Yongin-si, Gyeonggi-do (KR)

(72) Inventors: Seong Ryong Nam, Uiwang-si (KR); Chang Soo Woo, Uiwang-si (KR); Chang Min Lee, Uiwang-si (KR); Sung Min Ko, Uiwang-si (KR); Han Sung Yu, Uiwang-si (KR); Ji Yeon Lee, Uiwang-si (KR); Kyoung Jin Ha, Uiwang-si (KR)

(73) Assignee: SAMSUNG SDI CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 14/671,110

(22) Filed: Mar. 27, 2015

(65) Prior Publication Data

US 2015/0280151 A1 Oct. 1, 2015

(30) Foreign Application Priority Data

Mar. 28, 2014 (KR) .................. 10-2014-0037105
Mar. 18, 2015 (KR) .................. 10-2015-0037718

(51) Int. Cl.

| | | |
|---|---|---|
| *C08L 43/04* | (2006.01) | |
| *H01L 51/00* | (2006.01) | |
| *C08F 290/06* | (2006.01) | |
| *C09D 183/10* | (2006.01) | |
| *C08L 33/14* | (2006.01) | |
| *C08G 77/20* | (2006.01) | |
| *C08G 77/442* | (2006.01) | |
| *C08G 77/00* | (2006.01) | |
| *H01L 51/52* | (2006.01) | |

(52) U.S. Cl.
CPC ...... *H01L 51/0094* (2013.01); *C08F 290/068* (2013.01); *C08L 33/14* (2013.01); *C09D 183/10* (2013.01); *C08G 77/20* (2013.01); *C08G 77/442* (2013.01); *C08G 77/80* (2013.01); *C08L 43/04* (2013.01); *H01L 51/0043* (2013.01); *H01L 51/5256* (2013.01)

(58) Field of Classification Search
CPC ...................................................... C08L 43/04
See application file for complete search history.

(56) References Cited

U.S. PATENT DOCUMENTS

| | | | | |
|---|---|---|---|---|
| 2,956,044 A | * | 10/1960 | Merker | ............... C08F 230/08 525/29 |
| 4,743,667 A | * | 5/1988 | Mizutani | ............. C08F 230/08 526/245 |
| 2003/0174375 A1 | * | 9/2003 | Jethmalani | ............. A61L 27/48 359/234 |
| 2007/0035698 A1 | * | 2/2007 | Jethmalani | ............. A61F 2/16 351/200 |
| 2013/0068304 A1 | | 3/2013 | Kanematsu et al. | |

FOREIGN PATENT DOCUMENTS

| | | |
|---|---|---|
| CN | 103309162 A | 9/2013 |
| EP | 2 085 411 A2 | 8/2009 |
| JP | 2009-280692 A | 12/2009 |
| KR | 10-2011-0071039 A | 6/2011 |
| KR | 10-2014-0034882 A | 3/2014 |
| WO | WO 2013/187577 A1 | 12/2013 |

OTHER PUBLICATIONS

English translation (machine generated) KR 2014-034882, Mar. 2014.*
Taiwanese Office Action dated Feb. 18, 2016 in Corresponding Taiwanese Patent Application No. 104110266.
Extended European Search Report dated Jul. 7, 2015 in Corresponding European Patent Application No. 15161125.8.
Chinese Office Action dated Aug. 18, 2016 in Corresponding Chinese Patent Application No. 201510142313.5.

* cited by examiner

*Primary Examiner* — Margaret Moore
(74) *Attorney, Agent, or Firm* — Lee & Morse, P.C.

(57) ABSTRACT

A composition for encapsulation of an organic light emitting diode comprising a photocurable monomer, a silicon-containing monomer, and an initiator, wherein the silicon-containing monomer is represented by Formula 1, and an organic light emitting diode display are disclosed.

10 Claims, 1 Drawing Sheet

COMPOSITION FOR ENCAPSULATION OF ORGANIC LIGHT EMITTING DIODE AND ORGANIC LIGHT EMITTING DIODE DISPLAY MANUFACTURED USING THE SAME

CROSS-REFERENCE TO RELATED APPLICATION

Korean Patent Application No. 10-2014-0037105, filed Mar. 28, 2014, and Korean Patent Application No. 10-2015-0037718, filed Mar. 18, 2015, in the Korean Intellectual Property Office, and entitled: "Composition for Encapsulation of Organic Light Emitting Diode and Organic Light Emitting Diode Display Manufactured Using the Same," are incorporated by reference herein in their entirety.

BACKGROUND

1. Field

Embodiments relate to a composition for encapsulation of an organic light emitting diode and an organic light emitting diode (OLED) display manufactured using the same.

2. Description of the Related Art

An OLED display is an emissive type display and includes an organic light emitting diode.

SUMMARY

Embodiments are directed to a composition for encapsulation of an organic light emitting diode and an organic light emitting diode (OLED) display manufactured using the same.

The embodiments may be realized by providing a composition for encapsulation of an organic light emitting diode, the composition including a photocurable monomer; a silicon-containing monomer; and an initiator, wherein the silicon-containing monomer is represented by Formula 1:

<Formula 1> wherein, in Formula 1, $R_1$ and $R_2$ are each independently a single bond, a substituted or unsubstituted $C_1$ to $C_{20}$ alkylene group, a substituted or unsubstituted $C_1$ to $C_{30}$ alkylene ether group, *—N(R')—R"—* (wherein * represents a binding site for an element, R' is a substituted or unsubstituted $C_1$ to $C_{30}$ alkyl group, and R" is a substituted or unsubstituted $C_1$ to $C_{20}$ alkylene group), a substituted or unsubstituted $C_6$ to $C_{30}$ arylene group, a substituted or unsubstituted $C_7$ to $C_{30}$ arylalkylene group, or *—O—R"—* (wherein * represents a binding site for an element and R" is a substituted or unsubstituted $C_1$ to $C_{20}$ alkylene group);

$X_1$, $X_2$, $X_3$, $X_4$, $X_5$ and $X_6$ are each independently hydrogen, a substituted or unsubstituted $C_1$ to $C_{30}$ alkyl group, a substituted or unsubstituted $C_1$ to $C_{30}$ alkyl ether group, *—N(R')(R")* (wherein * represents a binding site for an element, and R' and R" are the same or different and are hydrogen or a substituted or unsubstituted $C_1$ to $C_{30}$ alkyl group), a substituted or unsubstituted $C_1$ to $C_{30}$ alkylsulfide group, a substituted or unsubstituted $C_6$ to $C_{30}$ aryl group, or a substituted or unsubstituted $C_7$ to $C_{30}$ arylalkyl group;

at least one of $X_1$, $X_2$, $X_3$, $X_4$, $X_5$ and $X_6$ is a substituted or unsubstituted $C_6$ to $C_{30}$ aryl group; n is an integer from 0 to 30, or ranges on average from 0 to 30; and $Y_1$ and $Y_2$ are each independently a group represented by Formula 2:

<Formula 2> wherein, in Formula 2, * represents a binding site to an adjacent atom, and Z is hydrogen or a substituted or unsubstituted $C_1$ to $C_{30}$ alkyl group.

$R_1$ and $R_2$ may each independently be a $C_1$ to $C_5$ alkylene group; $X_1$, $X_2$, $X_3$, $X_4$, $X_5$ and $X_6$ may each independently be a $C_1$ to $C_5$ alkyl group or a $C_6$ to $C_{30}$ aryl group; and at least one of $X_1$, $X_2$, $X_3$, $X_4$, $X_5$ and $X_6$ may be a $C_6$ to $C_{10}$ aryl group.

The silicon-containing monomer represented by Formula 1 may be represented by one of the following Formulae 3 to 8:

<Formula 3>

<Formula 4>

<Formula 5>

<Formula 6>

-continued

<Formula 7>

<Formula 8>

The silicon-containing monomer may have a molecular weight of about 200 g/mol to about 2,000 g/mol.

The silicon-containing monomer may be present in the composition in an amount of about 10 wt % to about 70 wt %, based on a total weight of the photocurable monomer, the silicon-containing monomer, and the initiator.

The photocurable monomer may include a $C_1$ to $C_{30}$ monoalcohol (meth)acrylate; a polyalkyleneglycol di(meth)acrylate; and at least one of a di(meth)acrylate of a $C_2$ to $C_{20}$ diol, a tri(meth)acrylate of a $C_3$ to $C_{20}$ triol, and a tetra(meth)acrylate of a $C_4$ to $C_{20}$ tetraol.

The polyalkyleneglycol di(meth)acrylate may include at least one of a poly(ethylene glycol) di(meth)acrylate, a diethylene glycol di(meth)acrylate, a triethylene glycol di(meth)acrylate, a tetraethylene glycol di(meth)acrylate, a tri(propylene glycol) di(meth)acrylate, and a poly(propylene glycol) di(meth)acrylate.

A total amount of the photocurable monomer and the silicon-containing monomer in the composition for encapsulation of an organic light emitting diode may be about 95 wt % or more, based on a total weight of the photocurable monomer, the silicon-containing monomer, and the initiator.

The embodiments may be realized by providing an organic light emitting diode display including an organic light emitting diode; and a barrier stack on the organic light emitting diode, the barrier stack including an inorganic barrier layer and an organic barrier layer, wherein the organic barrier layer is prepared from the composition for encapsulation of an organic light emitting diode according to an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

As used herein, the term "(meth)acryl" may refer to "acryl" and/or "methacryl". Further, as used herein and in the appended claims, the term "(meth)acrylate" may refer to "acrylate" and/or "methacrylate". As used herein, unless otherwise stated, the term "substituted" in "substituted or unsubstituted" means that at least one hydrogen atom among functional groups is substituted with a halogen (F, Cl, Br or I), a hydroxyl group, a nitro group, a cyano group, an imino group (=NH, =NR, wherein R is a $C_1$ to $C_{10}$ alkyl group), an amino group (—$NH_2$, —NH(R'), —N(R")(R'")), wherein R', R" and R'" are each independently a $C_1$ to $C_{10}$ alkyl group), an amidino group, a hydrazine or hydrazone group, a carboxyl group, a $C_1$ to $C_{20}$ alkyl group, a $C_6$ to $C_{30}$ aryl group, a $C_3$ to $C_{30}$ cycloalkyl group, a $C_3$ to $C_{30}$ heteroaryl group, or a $C_2$ to $C_{30}$ heterocycloalkyl group.

A composition for encapsulation of an organic light emitting diode according to an embodiment may include, e.g., a photocurable monomer; a silicon-containing monomer; and an initiator. The silicon-containing monomer may be represented by Formula 1, below.

<Formula 1>

In Formula 1, $R_1$ and $R_2$ may each independently be or include, e.g., a single bond, a substituted or unsubstituted $C_1$ to $C_{20}$ alkylene group, a substituted or unsubstituted $C_1$ to $C_{30}$ alkylene ether group, *—N(R')—R"—* (wherein * represents a binding site for an element, R' is a substituted or unsubstituted $C_1$ to $C_{30}$ alkyl group, and R" is a substituted or unsubstituted $C_1$ to $C_{20}$ alkylene group), a substituted or unsubstituted $C_6$ to $C_{30}$ arylene group, a substituted or unsubstituted $C_7$ to $C_{30}$ arylalkylene group, or *—O—R"—* (wherein * represents a binding site for an element and R" is a substituted or unsubstituted $C_1$ to $C_{20}$ alkylene group).

$X_1$, $X_2$, $X_3$, $X_4$, $X_5$ and $X_6$ may each independently be or include, e.g., hydrogen, a substituted or unsubstituted $C_1$ to $C_{30}$ alkyl group, a substituted or unsubstituted $C_1$ to $C_{30}$ alkyl ether group, *—N(R')(R") (wherein * represents a binding site for an element, and R' and R" are the same or different and are hydrogen or a substituted or unsubstituted $C_1$ to $C_{30}$ alkyl group), a substituted or unsubstituted $C_1$ to $C_{30}$ alkylsulfide group, a substituted or unsubstituted $C_6$ to $C_{30}$ aryl group, or a substituted or unsubstituted $C_7$ to $C_{30}$ arylalkyl group.

In an implementation, at least one of $X_1$, $X_2$, $X_3$, $X_4$, $X_5$ and $X_6$ may be or include, e.g., a substituted or unsubstituted $C_6$ to $C_{30}$ aryl group.

In an implementation, n may be an integer from 0 to 30, or may range on average from 0 to 30.

$Y_1$ and $Y_2$ may each independently be, e.g., a group represented by the following Formula 2.

<Formula 2>

In Formula 2, * represents a binding site to a neighboring atom, and Z may be or may include, e.g., hydrogen or a substituted or unsubstituted $C_1$ to $C_{30}$ alkyl group.

The composition for encapsulation of an organic light emitting diode may include the silicon-containing monomer thereby realizing an organic barrier layer which has high resistance to plasma to improve reliability of the organic light emitting diode.

In the present invention, the photocurable monomer, the silicon-containing monomer and the initiator are different compounds.

Hereinafter, the photocurable monomer, the silicon-containing monomer and the initiator will be described in more detail.

Photocurable Monomer

The photocurable monomer may include a photocurable monomer excluding the silicon-containing monomer. Specifically, The photocurable monomer may refer to a non-silicon-containing, e.g., silicon-free, photocurable monomer and may include a photocurable functional group (e.g., a (meth)acrylate group, a vinyl group, or the like).

The photocurable monomer may be a monofunctional monomer, a polyfunctional monomer, or a mixture thereof. As used herein, the term "monofunctional monomer" may refer to a monomer having one photocurable functional group. In addition, the term "polyfunctional monomer" may refer to a monomer having two or more photocurable monomers. In an implementation, the photocurable monomer may include, e.g., 1 to 30, 1 to 20, or 1 to 6 photocurable functional groups.

In an implementation, the photocurable monomer may include, e.g., substituted or unsubstituted vinyl group-containing $C_6$ to $C_{20}$ aromatic compounds; $C_1$ to $C_{20}$ alkyl group-containing unsaturated carboxylic acid esters, $C_3$ to $C_{20}$ cycloalkyl group-containing unsaturated carboxylic acid esters, $C_6$ to $C_{20}$ aromatic group-containing unsaturated carboxylic acid esters, or hydroxyl group and $C_1$ to $C_{20}$ alkyl group-containing unsaturated carboxylic acid esters; $C_1$ to $C_{20}$ aminoalkyl group-containing unsaturated carboxylic acid esters; vinyl esters of $C_1$ to $C_{20}$ saturated or unsaturated carboxylic acids; glycidyl esters of unsaturated $C_1$ to $C_{20}$ carboxylic acid; vinyl cyanide compounds; unsaturated amide compounds; monofunctional (meth)acrylates of monohydric or polyhydric alcohols; and polyfunctional (meth)acrylates of monohydric or polyhydric alcohols. The term "polyhydric alcohol" refers to alcohols containing two or more, e.g., 2 to 20, 2 to 10, or 2 to 6 hydroxyl groups.

As used herein, the term "monofunctional (meth)acrylate" may refer to a monomer having one (meth)acrylate group. In addition, the term "polyfunctional (meth)acrylate" may refer to a monomer having two or more (meth)acrylate groups.

In an implementation, the photocurable monomer may include, e.g., $C_6$ to $C_{20}$ aromatic compounds containing an alkenyl group including a vinyl group, such as styrene, α-methyl styrene, vinyl toluene, vinyl benzyl ether, and vinyl benzyl methyl ether; unsaturated carboxylic acid esters, such as methyl (meth)acrylate, ethyl (meth)acrylate, butyl (meth)acrylate, 2-hydroxyethyl (meth)acrylate, 2-hydroxybutyl (meth)acrylate, hexyl (meth)acrylate, octyl (meth)acrylate, nonyl (meth)acrylate, decyl (meth)acrylate, undecyl (meth)acrylate, dodecyl (meth)acrylate, cyclohexyl (meth)acrylate, benzyl (meth)acrylate, phenyl (meth)acrylate, and the like; unsaturated carboxylic acid aminoalkyl esters, such as 2-aminoethyl (meth)acrylate, 2-dimethylaminoethyl (meth)acrylate, and the like; saturated or unsaturated carboxylic acid vinyl esters, such as vinyl acetate, vinyl benzoate, and the like; glycidyl esters of unsaturated $C_1$ to $C_{20}$ carboxylic acid, such as glycidyl (meth)acrylate; vinyl cyanide compounds, such as (meth)acrylonitrile; unsaturated amide compounds, such as (meth)acrylamide.

In some embodiments, the photocurable monomer may include at least one of the monofunctional (meth)acrylates of monohydric or polyhydric alcohols, and the polyfunctional (meth)acrylates of monohydric or polyhydric alcohols.

More specifically, the photocurable monomer includes mono(meth)acrylates of $C_1$ to $C_{30}$ monohydric alcohols such as methyl (meth)acrylate, ethyl (meth)acrylate, butyl (meth)acrylate, hexyl (meth)acrylate, octyl (meth)acrylate, nonyl (meth)acrylate, decyl (meth)acrylate, undecyl (meth)acrylate, dodecyl (meth)acrylate, cyclohexyl (meth)acrylate, benzyl (meth)acrylate, and phenyl (meth)acrylate; monoalkylene glycol di(meth)acrylates or polyalkylene glycol di(meth)acrylates or mixtures thereof including at least one of ethylene glycol di(meth)acrylate, diethylene glycol di(meth)acrylate, triethylene glycol di(meth)acrylate, tetraethylene glycol di(meth)acrylate, tri(propylene glycol) di(meth)acrylate, and poly(propylene glycol) di(meth)acrylate; di(meth)acrylates of a $C_2$ to $C_{20}$ diol, triol, tetraol, pentaol or hexaol including 1,4-butanediol di(meth)acrylate, 1,6-hexanediol di(meth)acrylate, octanediol di(meth)acrylate, nonanediol di(meth)acrylate, decanediol di(meth)acrylate, undecanediol di(meth)acrylate, dodecanediol di(meth)acrylate, neopentyl glycol di(meth)acrylate, pentaerythritol di(meth)acrylate, dipentaerythritol di(meth)acrylate, and the like; tri(meth)acrylates of $C_3$ to $C_{20}$ triol, tetraol, pentaol or hexaol including trimethylolpropane tri(meth)acrylate, pentaerythritol tri(meth)acrylate, dipentaerythritol tri(meth) acrylate, and the like; tetra(meth)acrylate of $C_4$ to $C_{20}$ tetraol, pentaol or hexaol including pentaerythritol tetra(meth)acrylate, dipentaerythritol tetra(meth)acrylate, and the like; penta(meth)acrylates of $C_4$ to $C_{20}$ pentaol or hexaol including dipentaerythritol penta(meth)acrylate and the like; hexa(meth)acrylates of $C_4$ to $C_{20}$ hexaol including dipentaerythritol hexa(meth)acrylate and the like; bisphenol A di(meth)acrylate; novolac epoxy (meth)acrylate, and the like.

The photocurable monomers may be used alone or in combination thereof. The same kind of photocurable monomer may also be used alone or as a mixture thereof.

The photocurable monomer may include a mixture of a monofunctional monomer and a polyfunctional monomer. In the mixture, the monofunctional monomer and the polyfunctional monomer may be present in a weight ratio from about 1:0.1 to about 1:20, for example, from about 1:0.5 to about 1:10.

The photocurable monomer may include at least one of polyfunctional (meth)acrylates, for example, a bi-functional (meth)acrylate, a tri-functional (meth)acrylate, and a tetra-functional (meth)acrylate, thereby realizing an organic barrier layer having low plasma etching rate.

The photocurable monomer may include a mixture of a) a bi-functional (meth)acrylate; and b) at least one of a tri-functional (meth)acrylate and a tetra-functional (meth)acrylate. In the mixture, the weight ratio of the a) bi-functional (meth)acrylate to the b) at least one of the tri-functional (meth)acrylate and the tetra-functional (meth) acrylate may range from 1:2 to 1:5. Within this range, it is possible to realize an organic barrier layer having low plasma etching rate.

In one embodiment, the photocurable monomer may include at least one of the following components i), ii), iii), iv) and v):

i) mono(meth)acrylates of $C_1$ to $C_{30}$ monohydric alcohols;

ii) monoalkylene glycol di(meth)acrylate, polyalkylene glycol di(meth)acrylate, or a mixture thereof;

iii) di(meth)acrylates of $C_2$ to $C_{20}$ diol, triol, tetraol, pentaol or hexaol; iv) tri(meth)acrylates of $C_3$ to $C_{20}$ triol, tetraol, pentaol or hexaol; and v) tetra(meth)acrylate of $C_4$ to $C_{20}$ tetraol, pentaol or hexaol.

In one embodiment, the photocurable monomer may include the following components:

ii) monoalkylene glycol di(meth)acrylate, polyalkylene glycol di(meth)acrylate or a mixture thereof; and at least one of iii) di(meth)acrylates of $C_2$ to $C_{20}$ diol, triol, tetraol, pentaol or hexaol, iv) tri(meth)acrylates of $C_3$ to $C_{20}$ triol, tetraol, pentaol or hexaol, and v) tetra(meth)acrylate of $C_4$ to $C_{20}$ tetraol, pentaol or hexaol.

In one embodiment, the photocurable monomer may include the following components:

ii) monoalkylene glycol di(meth)acrylate, polyalkylene glycol di(meth)acrylate or a mixture thereof; and iii) di(meth)acrylates of $C_2$ to $C_{20}$ diol, triol, tetraol, pentaol or hexaol.

In one embodiment, the photocurable monomer may include the following components:

ii) monoalkylene glycol di(meth)acrylate, polyalkylene glycol di(meth)acrylate or a mixture thereof;

iii) di(meth)acrylates of $C_2$ to $C_{20}$ diol, triol, tetraol, pentaol or hexaol; and at least one of iv) tri(meth)acrylate of $C_3$ to $C_{20}$ triol, tetraol, pentaol or hexaol and v) tetra(meth)acrylate of $C_4$ to $C_{20}$ tetraol, pentaol or hexaol.

In one embodiment, the photocurable monomer may include the following components:

ii) monoalkylene glycol di(meth)acrylate, polyalkylene glycol di(meth)acrylate or a mixture thereof;

iii) di(meth)acrylates of $C_2$ to $C_{20}$ diol, triol, tetraol, pentaol or hexaol; and v) tetra(meth)acrylate of $C_4$ to $C_{20}$ tetraol, pentaol or hexaol.

The components i), ii), iii), iv), and v) may be used alone or in combination thereof in the composition for encapsulation of an organic light emitting diode.

The component ii) can increase storage modulus after curing, reduce curing shrinkage, and reduce viscosity of the composition, thereby supplementing the properties of other photocurable monomers having relatively high viscosity. The photocurable monomer prepared using a mixture of the component ii) and at least one of the components iii), iv) and v) can realize an organic barrier layer having low plasma etching rate.

The component ii) may be present in an amount of about 10 wt % to about 80 wt %, specifically about 10 wt % to about 60 wt %, in the composition based on the total weight of the photocurable monomer, the silicon-containing monomer and the initiator. For example, the component ii) may be present in an amount of about 10 wt %, about 11 wt %, about 12 wt %, about 13 wt %, about 14 wt %, about 15 wt %, about 16 wt %, about 17 wt %, about 18 wt %, about 19 wt %, about 20 wt %, about 21 wt %, about 22 wt %, about 23 wt %, about 24 wt %, about 25 wt %, about 26 wt %, about 27 wt %, about 28 wt %, about 29 wt %, about 30 wt %, about 31 wt %, about 32 wt %, about 33 wt %, about 34 wt %, about 35 wt %, about 36 wt %, about 37 wt %, about 38 wt %, about 39 wt %, about 40 wt %, about 41 wt %, about 42 wt %, about 43 wt %, about 44 wt %, about 45 wt %, about 46 wt %, about 47 wt %, about 48 wt %, about 49 wt %, about 50 wt %, about 51 wt %, about 52 wt %, about 53 wt %, about 54 wt %, about 55 wt %, about 56 wt %, about 57 wt %, about 58 wt %, about 59 wt %, about 60 wt %, about 61 wt %, about 62 wt %, about 63 wt %, about 64 wt %, about 65 wt %, about 66 wt %, about 67 wt %, about 68 wt %, about 69 wt %, about 70 wt %, about 71 wt %, about 72 wt %, about 73 wt %, about 74 wt %, about 75 wt %, about 76 wt %, about 77 wt %, about 78 wt %, about 79 wt %, or about 80 wt % based on the total weight of the photocurable monomer, the silicon-containing monomer and the initiator. Within this range, the composition can lower water vapor permeability and reduce outgassing which can result from plasma upon manufacture of a thin film encapsulation layer, while realizing an organic barrier layer having low plasma etching rate.

The component iii) may be present in an amount of about 10 wt % to about 80 wt % specifically about 30 wt % to about 70 wt %, more specifically about 30 wt % to about 60 wt %, in the composition based on the total weight of the photocurable monomer, the silicon-containing monomer and the initiator. For example, the component iii) may be present in an amount of about 10 wt %, about 11 wt %, about 12 wt %, about 13 wt %, about 14 wt %, about 15 wt %, about 16 wt %, about 17 wt %, about 18 wt %, about 19 wt %, about 20 wt %, about 21 wt %, about 22 wt %, about 23 wt %, about 24 wt %, about 25 wt %, about 26 wt %, about 27 wt %, about 28 wt %, about 29 wt %, about 30 wt %, about 31 wt %, about 32 wt %, about 33 wt %, about 34 wt %, about 35 wt %, about 36 wt %, about 37 wt %, about 38 wt %, about 39 wt %, about 40 wt %, about 41 wt %, about 42 wt %, about 43 wt %, about 44 wt %, about 45 wt %, about 46 wt %, about 47 wt %, about 48 wt %, about 49 wt %, about 50 wt %, about 51 wt %, about 52 wt %, about 53 wt %, about 54 wt %, about 55 wt %, about 56 wt %, about 57 wt %, about 58 wt %, about 59 wt %, about 60 wt %, about 61 wt %, about 62 wt %, about 63 wt %, about 64 wt %, about 65 wt %, about 66 wt %, about 67 wt %, about 68 wt %, about 69 wt %, about 70 wt %, about 71 wt %, about 72 wt %, about 73 wt %, about 74 wt %, about 75 wt %, about 76 wt %, about 77 wt %, about 78 wt %, about 79 wt %, or about 80 wt % based on the total weight of the photocurable monomer, the silicon-containing monomer and the initiator. Within this range, the composition can lower water vapor permeability and reduce outgassing which can result from plasma upon manufacture of a thin film encapsulation layer, while realizing an organic barrier layer having low plasma etching rate.

The component v) may be present in an amount of about 0 wt % to about 50 wt %, specifically about 0 wt % to about 20 wt %, more specifically about 0 wt % to about 10 wt %, in the composition based on the total weight of the photocurable monomer, the silicon-containing monomer and the initiator. For example, the component v) may be present in an amount of about 0 wt %, about 1 wt %, about 2 wt %, about 3 wt %, about 4 wt %, about 5 wt %, about 6 wt %, about 7 wt %, about 8 wt %, about 9 wt %, about 10 wt %, about 11 wt %, about 12 wt %, about 13 wt %, about 14 wt %, about 15 wt %, about 16 wt %, about 17 wt %, about 18 wt %, about 19 wt %, about 20 wt %, about 21 wt %, about 22 wt %, about 23 wt %, about 24 wt %, about 25 wt %, about 26 wt %, about 27 wt %, about 28 wt %, about 29 wt

%, about 30 wt %, about 31 wt %, about 32 wt %, about 33 wt %, about 34 wt %, about 35 wt %, about 36 wt %, about 37 wt %, about 38 wt %, about 39 wt %, about 40 wt %, about 41 wt %, about 42 wt %, about 43 wt %, about 44 wt %, about 45 wt %, about 46 wt %, about 47 wt %, about 48 wt %, about 49 wt %, about 50 wt % based on the total weight of the photocurable monomer, the silicon-containing monomer and the initiator. Within this range, the composition can lower water vapor permeability and reduce outgassing which can result from plasma upon manufacture of a thin film encapsulation layer, while realizing an organic barrier layer having low plasma etching rate.

The photocurable monomer may be present in an amount of about 10% by weight (wt %) to about 80 wt %, specifically, about 50 wt % to about 75 wt %, for example, about 55 wt % to about 70 wt %, in the composition based on the total weight of the photocurable monomer, the silicon-containing monomer and the initiator. For example, the photocurable monomer may be present in an amount of about 10 wt %, about 11 wt %, about 12 wt %, about 13 wt %, about 14 wt %, about 15 wt %, about 16 wt %, about 17 wt %, about 18 wt %, about 19 wt %, about 20 wt %, about 21 wt %, about 22 wt %, about 23 wt %, about 24 wt %, about 25 wt %, about 26 wt %, about 27 wt %, about 28 wt %, about 29 wt %, about 30 wt %, about 31 wt %, about 32 wt %, about 33 wt %, about 34 wt %, about 35 wt %, about 36 wt %, about 37 wt %, about 38 wt %, about 39 wt %, about 40 wt %, about 41 wt %, about 42 wt %, about 43 wt %, about 44 wt %, about 45 wt %, about 46 wt %, about 47 wt %, about 48 wt %, about 49 wt %, about 50 wt %, about 51 wt %, about 52 wt %, about 53 wt %, about 54 wt %, about 55 wt %, about 56 wt %, about 57 wt %, about 58 wt %, about 59 wt %, about 60 wt %, about 61 wt %, about 62 wt %, about 63 wt %, about 64 wt %, about 65 wt %, about 66 wt %, about 67 wt %, about 68 wt %, about 69 wt %, about 70 wt %, about 71 wt %, about 72 wt %, about 73 wt %, about 74 wt %, about 75 wt %, about 76 wt %, about 77 wt %, about 78 wt %, about 79 wt %, or about 80 wt % based on the total weight of the photocurable monomer, the silicon-containing monomer and the initiator. Within this range, the composition can lower water vapor permeability and reduce outgassing which can result from plasma upon manufacture of a thin film encapsulation layer, while realizing an organic barrier layer having low plasma etching rate.

Silicon-Containing Monomer

The silicon-containing monomer may be a silicon-containing photocurable monomer that includes silicon and a photocurable functional group at ends, e.g., both ends, thereof. In an implementation, the photocurable functional group may include, e.g., substituted or unsubstituted vinyl groups, substituted or unsubstituted acrylate groups, or substituted or unsubstituted methacrylate groups.

In an implementation, the silicon-containing monomer may be represented by the following Formula 1.

<Formula 1>

In Formula 1, $R_1$ and $R_2$ may each independently be or include, e.g., a single bond (such that Si and Si are directly connected to Y1 and Y2, respectively, without intervening atoms), a substituted or unsubstituted $C_1$ to $C_{20}$ alkylene group, a substituted or unsubstituted $C_1$ to $C_{30}$ alkylene ether group, *—N(R')—R"—* (wherein * represents a binding site for an element, R' is a substituted or unsubstituted $C_1$ to $C_{30}$ alkyl group, and R" is a substituted or unsubstituted $C_1$ to $C_{20}$ alkylene group), a substituted or unsubstituted $C_6$ to $C_{30}$ arylene group, a substituted or unsubstituted $C_7$ to $C_{30}$ arylalkylene group, or *—O—R"—* (wherein * represents a binding site for an element and R" is a substituted or unsubstituted $C_1$ to $C_{20}$ alkylene group).

$X_1$, $X_2$, $X_3$, $X_4$, $X_5$ and $X_6$ may each independently be or include, e.g., hydrogen, a substituted or unsubstituted $C_1$ to $C_{30}$ alkyl group, a substituted or unsubstituted $C_1$ to $C_{30}$ alkyl ether group, *—N(R')(R") (wherein * represents a binding site for an element, and R' and R" are the same or different and are hydrogen or a substituted or unsubstituted $C_1$ to $C_{30}$ alkyl group), a substituted or unsubstituted $C_1$ to $C_{30}$ alkylsulfide group, a substituted or unsubstituted $C_6$ to $C_{30}$ aryl group, or a substituted or unsubstituted $C_7$ to $C_{30}$ arylalkyl group.

In an implementation, at least one of $X_1$, $X_2$, $X_3$, $X_4$, $X_5$ and $X_6$ may be a substituted or unsubstituted $C_6$ to $C_{30}$ aryl group.

In an implementation, n may be an integer from 0 to 30, or may range on average from 0 to 30.

$Y_1$ and $Y_2$ may each independently be, eg., a group represented by the following Formula 2.

<Formula 2>

In Formula 2, * represents a binding site for an element, and Z may be or may include, e.g., hydrogen or a substituted or unsubstituted $C_1$ to $C_{30}$ alkyl group. And n is an integer from 0 to 30, or ranges on average from 0 to 30).

As used herein, the "single bond" means that Si is directly bonded to $Y_1$ ($Y_1$—Si) without any intervening atom or that Si is directly bonded to $Y_2$ (Si—$Y_2$) without any intervening atom.

In an implementation, $R_1$ and $R_2$ may each independently be, e.g., a $C_1$ to $C_5$ alkylene group or a single bond. Specifically, $X_1$, $X_2$, $X_3$, $X_4$, $X_5$ and $X_6$ may each independently be, e.g., a $C_1$ to $C_5$ alkyl group or a $C_6$ to $C_{10}$ aryl group; at least one of $X_1$, $X_2$, $X_3$, $X_4$, $X_5$ and $X_6$ may be a $C_6$ to $C_{10}$ aryl group; More specifically, $X_1$, $X_2$, $X_3$, $X_4$, $X_5$ and $X_6$ may be a $C_1$ to $C_5$ alkyl group or a $C_6$ to $C_{10}$ aryl group, and one, two, three or six of $X_1$, $X_2$, $X_3$, $X_4$, $X_5$ and $X_6$ may be a $C_6$ to $C_{10}$ aryl group. More specifically, $X_1$, $X_2$, $X_3$, $X_4$, $X_5$ and $X_6$ are a methyl group, an ethyl group, a propyl group, a butyl group, a pentyl group, a phenyl group, or a naphthyl group, and one, two, three or six of $X_1$, $X_2$, $X_3$, $X_4$, $X_5$ and $X_6$ may be a phenyl group or a naphthyl group. and n may be an integer from 1 to 5.

In an implementation, the silicon-containing monomer may be represented by one of the following Formulae 3 to 8.

<Formula 3>
<Formula 4>
<Formula 5>
<Formula 6>
<Formula 7>
<Formula 8>

The silicon-containing monomer may include at least one substituted or unsubstituted $C_6$ to $C_{30}$ aryl group bonded to silicon, thereby realizing an organic barrier layer having high resistance to plasma that may be used in deposition of an inorganic barrier layer in an OLED encapsulation structure in which the organic barrier layer and the inorganic barrier layer are stacked one above another.

The silicon-containing monomer may have a molecular weight of, e.g., about 100 g/mol to about 2,000 g/mol, or about 200 g/mol to about 1,000 g/mol. Within this range, the composition can realize an organic barrier layer having excellent coating properties and low etching rate under plasma.

The silicon-containing monomer may be prepared by suitable methods, or may be commercially available. For example, the silicon-containing monomer may be prepared by reacting a siloxane compound having at least one silicon-connected aryl group with a compound increasing carbon number (e.g., allyl alcohol), and reacting (meth)acryloyl chloride with the resulting reactant. Alternatively, the silicon-containing monomer may be prepared by reacting a siloxane compound having at least one silicon-connected aryl group with (meth)acryloyl chloride, without being limited thereto.

The silicon-containing monomer may be used alone or as a mixture thereof.

The silicon-containing monomer may be present in the composition in an amount of, e.g., about 10 wt % to about 70 wt %, about 15 wt % to about 50 wt %, or about more specifically about 15 wt % to about 49 wt %, in the composition based on the total weight of the photocurable monomer, the silicon-containing monomer and the initiator. For example, the silicon-containing monomer may be present in an amount of about 10 wt %, about 11 wt %, about 12 wt %, about 13 wt %, about 14 wt %, about 15 wt %, about 16 wt %, about 17 wt %, about 18 wt %, about 19 wt %, about 20 wt %, about 21 wt %, about 22 wt %, about 23 wt %, about 24 wt %, about 25 wt %, about 26 wt %, about 27 wt %, about 28 wt %, about 29 wt %, about 30 wt %, about 31 wt %, about 32 wt %, about 33 wt %, about 34 wt %, about 35 wt %, about 36 wt %, about 37 wt %, about 38 wt %, about 39 wt %, about 40 wt %, about 41 wt %, about 42 wt %, about 43 wt %, about 44 wt %, about 45 wt %, about 46 wt %, about 47 wt %, about 48 wt %, about 49 wt %, about 50 wt %, about 51 wt %, about 52 wt %, about 53 wt %, about 54 wt %, about 55 wt %, about 56 wt %, about 57 wt %, about 58 wt %, about 59 wt %, about 60 wt %, about 61 wt %, about 62 wt %, about 63 wt %, about 64 wt %, about 65 wt %, about 66 wt %, about 67 wt %, about 68 wt %, about 69 wt %, about 70 wt % in the composition based on the total weight of the photocurable monomer, the silicon-containing monomer and the initiator. Within this range, the composition may help lower water vapor permeability and may help reduce outgassing, which may otherwise result from plasma upon the manufacture of a thin film encapsulation layer, while realizing an organic barrier layer having low etching rate under plasma.

The total amount of the photocurable monomer and the silicon-containing monomer in the composition for encapsulation of an organic light emitting diode may be, e.g., about 95 wt % or more, or 95 wt % to 99 wt %, in the composition based on the total weight of the photocurable monomer, the silicon-containing monomer and the initiator. For example, the total amount of the photocurable monomer and the silicon-containing monomer in the composition for encapsulation of an organic light emitting diode may be 95 wt %, 96 wt %, 97 wt %, 98 wt %, 99 wt %, or 100 wt % in the composition based on the total weight of the photocurable monomer, the silicon-containing monomer and the initiator. Within this range, the composition may realize an organic barrier layer having low etching rate under plasma.

Initiator

The initiator may include a suitable photopolymerization initiator capable of performing a photocuring reaction. For example, the photopolymerization initiator may include a triazine initiator, an acetophenone initiator, a benzophenone initiator, a thioxanthone initiator, a benzoin initiator, a phosphorus initiator, an oxime initiator, or mixtures thereof.

Examples of the phosphorus initiator may include diphenyl(2,4,6-trimethylbenzoyl)phosphine oxide, benzyl(diphenyl) phosphine oxide, and mixtures thereof. For example, a phosphorus initiator can provide further improved initiation performance under UV light having a long wavelength in the composition.

The initiators may be used alone or as a mixture thereof. The initiator may be present in the composition in an amount of, e.g., about 1 wt % to about 40 wt %, or about 1 wt % to about 10 wt %, in the composition based on the total weight of the photocurable monomer, the silicon-containing monomer and the initiator. For example, the initiator may be present in an amount of about 1 wt %, about 2 wt %, about 3 wt %, about 4 wt %, about 5 wt %, about 6 wt %, about 7 wt %, about 8 wt %, about 9 wt %, about 10 wt %, about 11 wt %, about 12 wt %, about 13 wt %, about 14 wt %, about 15 wt %, about 16 wt %, about 17 wt %, about 18 wt %, about 19 wt %, about 20 wt %, about 21 wt %, about 22 wt %, about 23 wt %, about 24 wt %, about 25 wt %, about 26 wt %, about 27 wt %, about 28 wt %, about 29 wt %, about 30 wt %, about 31 wt %, about 32 wt %, about 33 wt %, about 34 wt %, about 35 wt %, about 36 wt %, about 37 wt %, about 38 wt %, about 39 wt %, about 40 wt % in the composition based on the total weight of the photocurable monomer, the silicon-containing monomer and the initiator. Within this range, the composition allows sufficient photopolymerization under exposure to light and may be prevented from suffering deterioration in transmittance due to unreacted initiator remaining after photopolymerization.

The composition for encapsulation of an organic light emitting diode may be prepared by mixing the photocurable monomer, the silicon-containing monomer, and the initiator. For example, the composition may be prepared as a solvent-free composition. For example, when the composition is a solvent-free composition, wt % may be in terms of or based on a total weight of the photocurable monomer, the silicon-containing monomer, and the initiator.

The composition for encapsulation of an organic light emitting diode may be cured through UV irradiation at about 10 mW/cm$^2$ to about 500 mW/cm$^2$ for about 1 second to about 50 seconds.

The composition for encapsulating organic light emitting diodes may have a photocuring rate of, e.g., about 90% or higher, about 90% to about 99%, or about 91% to about 97%. Within this range, the composition may help realize a layer that does not suffer from a shift due to low curing shrinkage stress after curing, thereby allowing the composition to be used for encapsulation of devices.

The composition for encapsulation of an organic light emitting diode may have a viscosity of, e.g., about 10 cP to about 50 cP as measured at 25±2° C. Within this range, coating of the composition is possible.

The composition for encapsulation of an organic light emitting diode may have a light transmittance after curing of, e.g., about 95% or higher, or about 95% to about 99%. Within this range, the composition may provide improved visibility when the organic light emitting diode is encapsulated with the composition. Here, the light transmittance may be measured in the visible range, e.g., at a wavelength of 550 nm.

The composition for encapsulation of an organic light emitting diode may have a plasma etching rate after curing of, e.g., about 0% to about 20%, or about 0% to about 15%. Within this range, the composition may secure high reliability of the organic light emitting diode even in an OLED encapsulation structure where inorganic and organic barrier layers are sequentially formed.

The composition for encapsulation of an organic light emitting diode may be used in encapsulation of an organic light emitting diode. For example, the composition may form an organic barrier layer in the encapsulation structure where inorganic and organic barrier layers are sequentially formed. For example, the composition for encapsulation may be used in a flexible organic light emitting diode display.

The composition for encapsulation of an organic light emitting diode may also be used in encapsulation of a member for an apparatus, e.g., a member for displays, which may otherwise suffer from degradation or deterioration in quality due to permeation of gas or liquid in a surrounding environment, e.g., atmospheric oxygen and/or moisture and/or water vapor and due to permeation of chemicals used in the preparation of electronic products. Examples of the member for an apparatus may include illumination devices, metal sensor pads, microdisc lasers, electrochromic devices, photochromic devices, microelectromechanical systems, solar cells, integrated circuits, charge coupled devices, light emitting polymers, light emitting diodes, and the like.

An OLED display according to an embodiment may include an organic barrier layer formed of or prepared from (e.g., by curing) the composition for encapsulation of an OLED according to one embodiment. For example, the organic light emitting diode display may include: an organic light emitting diode; and a barrier stack formed on the organic light emitting diode and including an inorganic barrier layer and an organic barrier layer, wherein the organic barrier layer is formed of the composition for encapsulation of an OLED according to one embodiment. As a result, the organic light emitting diode display can exhibit high reliability.

Figure 1:
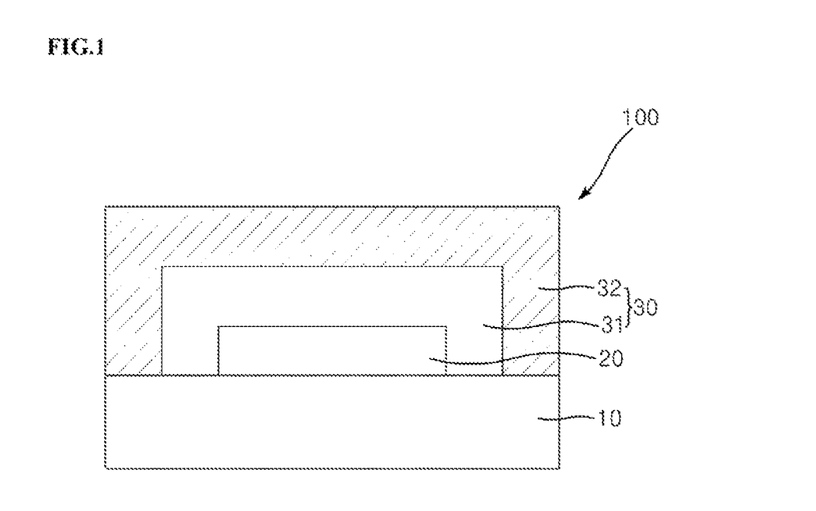
FIG. 1 illustrates a sectional view of an organic light emitting diode display according to one embodiment.

Hereafter, an OLED display according to one embodiment will be described with reference to FIG. 1. FIG. 1 illustrates a sectional view of the organic light emitting diode display according to one embodiment.

Referring to FIG. 1, the OLED display according to one embodiment may include; a substrate 10; an organic light emitting diode 20 on the substrate 10; and a barrier stack 30 on the organic light emitting diode 20 and including an inorganic barrier layer 31 and an organic barrier layer 32. The inorganic barrier layer 31 may adjoin the organic light emitting diode 20, and the organic barrier layer 32 may be formed of or from the composition for encapsulation of an OLED according to one embodiment.

The substrate 10 may be a suitable substrate such that an organic light emitting diode may be formed on the substrate. For example, the substrate may be formed of a material, such as transparent glass, a plastic sheet, and a silicon or metal substrate.

The organic light emitting diode 20 may be commonly used in an OLED display, and may include a first electrode, a second electrode, and an organic light emitting layer between the first electrode and the second electrode. In an implementation, the organic light emitting layer may have a structure wherein a hole injection layer, a hole transport layer, a light emitting layer, an electron transport layer, and an electron injection layer are sequentially stacked.

The barrier stack 30 may include the inorganic and organic barrier layers, and the inorganic and organic barrier layers may be composed of different components, thereby realizing the respective functions of encapsulating the organic light emitting diode.

The inorganic barrier layer may include different components from those of the organic barrier layer, thereby supplementing the effects of the organic barrier layer. The inorganic barrier layer may be formed of inorganic materials having excellent light transmittance and excellent moisture and/or oxygen barrier properties. For example, the inorganic barrier layer may include at least one of metals; nonmetals; compounds or alloys of at least two metals; compounds or alloys of at least two nonmetals; oxides of metals, nonmetals or mixtures thereof; fluorides of metals or nonmetals or mixtures thereof; nitrides of metals, nonmetals or mixtures thereof; carbides of metals, nonmetals or mixtures thereof; oxynitrides of metals, nonmetals or mixtures thereof; borides of metals, nonmetals or mixtures thereof; oxyborides of metals, nonmetals or mixtures thereof; silicides of metals, nonmetals or mixtures thereof; or mixtures thereof. The metals or nonmetals may include, e.g., silicon (Si), aluminum (Al), selenium (Se), zinc (Zn), antimony (Sb), indium (In), germanium (Ge), tin (Sn), bismuth (Bi), transition metals, or lanthanide metals. In an implementation, the inorganic barrier layer may include, e.g., silicon oxide ($SiO_x$), silicon nitride ($SiN_x$), silicon oxynitride ($SiO_xN_y$), zinc selenide (ZnSe), zinc oxide (ZnO), antimony trioxide ($Sb_2O_3$), aluminum oxide ($AlO_x$) (including alumina ($Al_2O_3$)), indium oxide ($In_2O_3$), or tin oxide ($SnO_2$).

The inorganic barrier layer may be deposited by a plasma process or a vacuum process, e.g., sputtering, chemical vapor deposition, plasma chemical vapor deposition, evaporation, sublimation, electron cyclotron resonance-plasma enhanced chemical vapor deposition, or combinations thereof.

The organic and inorganic barrier layers may be alternately deposited, thereby securing smoothing properties of the inorganic barrier layer, while preventing defects of one inorganic barrier layer from spreading to other inorganic barrier layers.

The organic barrier layer may be formed by combinations of processes, e.g., coating, deposition, and curing of the composition for encapsulation of an organic light emitting diode. For example, the organic barrier layer may be formed by coating the composition for encapsulation of an organic light emitting diode to a thickness of about 1 μm to about 50 μm, followed by curing the composition through irradiation at about 10 mW/cm$^2$ to about 500 mW/cm$^2$ for about 1 second to about 50 seconds.

The barrier stack may include a suitable number of organic and inorganic barrier layers. Combination of the organic and inorganic barrier layers may vary with a level of permeation resistance to oxygen and/or moisture and/or water vapor and/or chemicals. In an implementation, the organic and inorganic barrier layers may be, e.g., formed or provided in a total of 10 layers or less, or 2 layers to 7 layers. In an implementation, the organic and inorganic barrier layers may be, e.g., formed in a total 7 layers in the following order: inorganic layer/organic layer/inorganic layer/organic layer/inorganic layer/organic layer/inorganic layer.

In the barrier stack, the organic and inorganic barrier layers may be alternately deposited. This is because the aforementioned composition may have an effect on the organic barrier layer due to the properties thereof. As a result, the organic and inorganic barrier layers may help supplement or reinforce encapsulation of the member for the apparatus.

Figure 2:
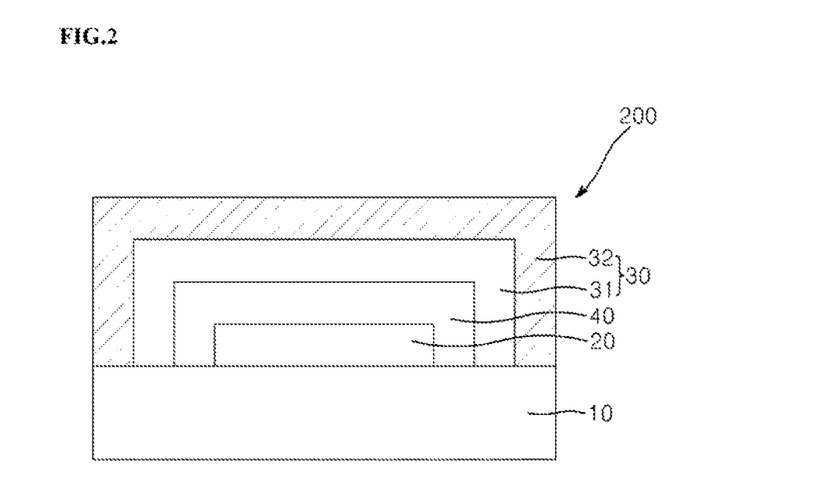
FIG. 2 illustrates a sectional view of an organic light emitting diode display according to another embodiment.

Hereinafter, an OLED display according to another embodiment will be described with reference to FIG. 2. FIG. 2 is a sectional view of the OLED display according to another embodiment.

Referring to FIG. 2, an OLED display 200 according to this embodiment may include a substrate 10, an organic light emitting diode 20 on the substrate 10, and a barrier stack 30 on the organic light emitting diode 20 and including an inorganic barrier layer 31 and an organic barrier layer 32. The inorganic barrier layer 31 may encapsulate an internal space 40 that contains the organic light emitting diode 20, and the organic barrier layer 32 may be formed of or from the composition for encapsulation of an OLED according to one embodiment. The OLED display 200 may be substantially the same as the OLED display 100 according to the above embodiment except that the inorganic barrier film 31 may not directly adjoin the organic light emitting diode 20, e.g., the internal space 40 may be between the organic light emitting diode 20 and the inorganic barrier film 31 of the barrier stack 30.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

PREPARATIVE EXAMPLE 1

Preparation of Silicon-containing Monomer

In a 1,000 ml flask provided with a cooling tube and a stirrer, 300 ml of ethyl acetate, 25 g of 3-phenyl-1,1,3,5,5-pentamethyltrisiloxane (Gelest, Inc.), and 43 g of allyl alcohol (Daejung Chemicals & Metals Co. Ltd) were placed, followed by nitrogen purging for 30 minutes. Thereafter, with 72 ppm of Pt-on-carbon black powder (Aldrich Chemical) placed in the flask, the temperature of the flask was increased to 80° C., followed by stirring for 4 hours. Residual solvents were removed by distillation. After introducing 71.5 g of the obtained compound into 300 ml of dichloromethane, 39 g of triethylamine was added thereto, followed by slowly introducing 34.3 g of acryloyl chloride, while stirring the components at 0° C. Residual solvents were removed through distillation, thereby preparing a compound represented by Formula 3. The obtained compound (molecular weight: 522.85 g/mol) had a purity of 97% as determined by HLPC.

($^1$H NMR: δ7.61, m, 3H; δ7.12, m, 2H; δ6.25, d, 2H; δ6.02, dd, 2H; δ5.82, t, 1H; δ5.59, d, 2H; δ3.87, m, 4H; δ1.54, m, 4H; δ0.58, m, 4H; δ0.02, m, 15H)

<Formula 3>

PREPARATIVE EXAMPLE 2

Preparation of Silicon-containing Monomer

A compound represented by Formula 4 was prepared in the same manner as in Preparative Example 1, except that 21 g of 3,3-diphenyl-1,1,5,5-tetramethyltrisiloxane was used instead of 25 g of 3-phenyl-1,1,3,5,5-pentamethyltrisiloxane, and 30.2 g of methacryloyl chloride was used instead of 34.3 g of acryloyl chloride. The obtained compound (molecular weight: 584.92 g/mol) had a purity of 96% as determined by HLPC.

($^1$H NMR: δ7.52, m, 6H: δ7.42, m, 4H: δ6.25, d, 2H: δ6.02, dd, 2H: δ5.82, t, 1H: δ5.59, d, 2H: δ3.86, m, 4H: δ1.52, m, 4H: δ0.58, m, 4H: δ0.04, m, 12H)

<Formula 4>

PREPARATIVE EXAMPLE 3

Preparation of Silicon-containing Monomer

A compound represented by Formula 5 was prepared in the same manner as in Preparative Example 1, except that 21 g of 1,3,5-triphenyl-1,3,5-trimethyltrisiloxane was used instead of 25 g of 3-phenyl-1,1,3,5,5-pentamethyltrisiloxane, and 31 g of methacryloyl chloride was used instead of 34.3 g of acryloyl chloride. The obtained compound (molecular weight: 646.99 g/mol) had a purity of 94% as determined by HLPC.

($^1$H NMR: δ7.51, m, 3H: δ7.29, m, 12H: δ6.25, d, 2H: δ6.02, dd, 2H: δ5.82, t, 1H: δ5.59, d, 2H: δ3.86, m, 4H: δ1.52, m, 4H: δ0.58, m, 4H: δ0.16, m, 9H)

<Formula 5>

PREPARATIVE EXAMPLE 4

Preparation of Silicon-containing Monomer

A compound represented by Formula 6 was prepared in the same manner as in Preparative Example 1, except that 19 g of 1,1,3,3,5,5-hexaphenyltrisiloxane was used instead of 25 g of 3-phenyl-1,1,3,5,5-pentamethyltrisiloxane, and 30 g of methacryloyl chloride was used instead of 34.3 g of acryloyl chloride. The obtained compound (molecular weight: 833.20 g/mol) had a purity of 92% as determined by HLPC.

($^1$H NMR: δ7.59~7.12, m, 30H: δ6.25, d, 2H: δ6.02, dd, 2H: δ5.82, t, 1H: 65.59, d, 2H: δ3.86, m, 4H: δ1.52, m, 4H: δ0.58, m, 4H)

<Formula 6>

Details of components used in the Examples and Comparative Examples are as follows:

(A) Photocurable monomer: (A1) Tetraethyleneglycol diacrylate, (A2) Decanediol diacrylate, (A3) Pentaerythritol tetraacrylate (Aldrich Chemical)

(B) Silicon-containing monomer: (B1) Monomer in Preparative Example 1, (B2) Monomer in Preparative Example 2, (B3) Monomer in Preparative Example 3, (B4) Monomer in Preparative Example 4

(C) Initiator: Darocur TPO (BASF Co., Ltd.)

(D) Monomer represented by Formula 9, X-22-164 (molecular weight: 460.78 g/mol, Shin-Etsu Chemical):

<Formula 9>

EXAMPLE 1

In a 125 ml brown polypropylene bottle, 20 parts by weight of (A1) tetraethyleneglycol diacrylate, 45 parts by weight of (A2) decanediol diacrylate, 30 parts by weight of (B 1) monomer in Preparative Example 1, and 5 parts by weight of (C) an initiator were placed, followed by mixing at ambient temperature for 3 hours using a shaker, thereby preparing a composition for encapsulation (viscosity at 25° C.: 25 cP).

EXAMPLES 2 to 8 AND COMPARATIVE EXAMPLES 1 To 3

Compositions for encapsulation were prepared in the same manner as in Example 1 except that the kinds and amounts of (A) photocurable monomer and the kinds and amounts of (B) silicon-containing monomer were changed as in Table 1 (unit: parts by weight).

COMPARATIVE EXAMPLE 4

A composition for encapsulation was prepared in the same manner as in Example 1 except that 30 parts by weight of (D) monomer represented by Formula 9 was used instead of (B 1) monomer in Preparative Example 1.

Each of the compositions prepared in Examples and Comparative Examples was evaluated as to the properties as listed in Table 1. Results are shown in Table 1.

TABLE 1

| | | Example | | | | | | | | Comparative Example | | | |
|---|---|---|---|---|---|---|---|---|---|---|---|---|---|
| | | 1 | 2 | 3 | 4 | 5 | 6 | 7 | 8 | 1 | 2 | 3 | 4 |
| A | A1 | 20 | 20 | 20 | 20 | 20 | 20 | 20 | 20 | 20 | 20 | 20 | 20 |
| | A2 | 45 | 45 | 45 | 45 | 40 | 40 | 40 | 40 | 75 | 70 | 65 | 45 |
| | A3 | — | — | — | — | 5 | 5 | 5 | 5 | — | 5 | 10 | — |
| B | B1 | 30 | — | — | — | 30 | — | — | — | — | — | — | — |
| | B2 | — | 30 | — | — | — | 30 | — | — | — | — | — | — |
| | B3 | — | — | 30 | — | — | — | 30 | — | — | — | — | — |
| | B4 | — | — | — | 30 | — | — | — | 30 | — | — | — | — |
| C | | 5 | 5 | 5 | 5 | 5 | 5 | 5 | 5 | 5 | 5 | 5 | 5 |
| D | | — | — | — | — | — | — | — | — | — | — | — | 30 |
| Plasma etching rate (%) | | 12.5 | 11.3 | 10.9 | 10.6 | 9.8 | 8.5 | 7.8 | 7.5 | 42.1 | 39.2 | 37.8 | 20.1 |
| Light transmittance (%) | | 96.4 | 95.2 | 95.6 | 95.9 | 96.3 | 95.4 | 94.8 | 95.5 | 95.3 | 94.3 | 93.1 | 96.3 |
| Photocuring rate (%) | | 91.2 | 93.4 | 92.2 | 95.6 | 93.9 | 94.8 | 96.1 | 93.3 | 83 | 87.5 | 89.8 | 88.5 |

As shown in Table 1, the composition for encapsulation of an OLED of Examples 1 to 8 realized an organic barrier layer exhibiting high photocuring rate and high light transmittance and having low etching rate under plasma.

Conversely, the compositions of Comparative Examples 1 to 3 (not including the silicon-containing monomer) exhibited low photocuring rate and high etching rate under plasma. In addition, although the composition of Comparative Example 4 (including the silicon-containing monomer not containing an aryl group) exhibited a lower photocuring rate and lower etching rate under plasma than Comparative Example 3, the composition exhibited higher etching rate than those of Examples 1 to 8 including an aryl group.

The evaluation procedures were as follows.

(1) Plasma etching rate: The composition for encapsulation was coated onto a Si wafer and photocured to form an organic barrier layer, followed by measuring the initial coating height (T1, unit: μm) of the organic barrier layer. The organic barrier layer was subjected to plasma treatment under conditions of ICP power: 2500 W, RE power: 300 W, DC bias: 200 V, Ar flow: 50 sccm, etching time: 1 min and pressure: 10 mTorr, followed by measuring the height (T2, unit: μm) of the organic barrier layer. The plasma etching rate of the organic barrier layer was calculated by Equation 1:

$$\text{Plasma etching rate of organic barrier layer}(\%) = (T1-T2)/T1 \times 100$$

(wherein T1 is the initial height of the organic barrier layer, and, T2 is the height of the organic barrier layer after plasma treatment).

(2) Light transmittance: The composition for encapsulation was subjected to UV curing under $N_2$ to prepare a 10 μm thick film, followed by measuring light transmittance of the film in the visible range of 550 nm using a spectrometer (Lambda 950, Perkin Elmer Co., Ltd.).

(3) Photocuring rate: The composition for encapsulation was measured as to intensity of absorption peaks in the vicinity of 1635 $cm^{-1}$ (C=C) and 1720 $cm^{-1}$ (C=O) using FT-IR (NICOLET 4700, Thermo Co., Ltd.). The composition was applied to a glass substrate using a spray, followed by UV curing through UV irradiation at 100 mW/$cm^2$ for 10 seconds, thereby obtaining a specimen having a size of 20 cm×20 cm×3 μm (width×length×thickness). Then, the intensity of absorption peaks of the cured film was measured in the vicinity of 1635 $cm^{-1}$ (C=C) and 1720 $cm^{-1}$ (C=O) using a FT-IR (NICOLET 4700, Thermo Co., Ltd.). Photocuring rate was calculated by Equation 2:

$$\text{Photocuring rate}(\%) = |1-(A/B)| \times 100$$

(wherein A is a ratio of the intensity of an absorption peak in the vicinity of 1635 $cm^{-1}$ to the intensity of an absorption peak in the vicinity of 1720 $cm^{-1}$ measured for the cured film, and B is a ratio of the intensity of an absorption peak in the vicinity of 1635 $cm^{-1}$ to the intensity of an absorption peak in the vicinity of 1720 $cm^{-1}$ measured for the composition for encapsulation).

By way of summation and review, an organic light emitting diode may suffer from deterioration in luminous properties upon contact with external moisture or oxygen, and the organic light emitting diode may be encapsulated with a composition for encapsulation. The organic light emitting diode may be encapsulated in a multilayer structure in which an inorganic barrier layer and an organic barrier layer are sequentially formed. The inorganic barrier layer may be formed by plasma deposition, which may cause the organic barrier layer to be etched by plasma. When the organic barrier layer is etched, an encapsulation function of the organic barrier layer could be damaged. As a result, light emitting properties and reliability of the organic light emitting diode may suffer.

The embodiments may provide a composition for encapsulation of an organic light emitting diode, which may realize an organic barrier layer having high resistance to plasma to improve reliability of an organic light emitting diode and exhibiting high photocuring rate and high light transmittance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for encapsulation of an organic light emitting diode, the composition comprising:
   25 wt % to 78 wt % of a photocurable monomer;
   21 wt % to 70 wt % of a silicon-containing monomer; and
   1 wt % to 40 wt % of an initiator, all wt% being based on a total weight of the photocurable monomer, the silicon-containing monomer, and the initiator,
   wherein the silicon-containing monomer is represented by Formula 1:

<Formula 1> wherein, in Formula 1,
$R_1$ and $R_2$ are each independently a single bond or an unsubstituted $C_1$ to $C_{20}$ alkylene group,
$X_1$, $X_2$, $X_3$, $X_4$, $X_5$ and $X_6$ are each independently hydrogen, a substituted or unsubstituted $C_1$ to $C_{30}$ alkyl group, a substituted or unsubstituted $C_1$ to $C_{30}$ alkyl ether group, *—N(R')(R") (wherein * represents a binding site for an element, and R' and R" are the same or different and are hydrogen or a substituted or unsubstituted $C_1$ to $C_{30}$ alkyl group), a substituted or unsubstituted $C_1$ to $C_{30}$ alkylsulfide group, a substituted or unsubstituted $C_6$ to $C_{30}$ aryl group, or a substituted or unsubstituted $C_7$ to $C_{30}$ arylalkyl group;
at least one of $X_1$, $X_2$, $X_3$, $X_4$, $X_5$ and $X_6$ is a substituted or unsubstituted $C_6$ to $C_{30}$ aryl group;
n is an integer from 0 to 30, or ranges on average from 0 to 30; and
$Y_1$ and $Y_2$ are each independently a group represented by Formula 2:

<Formula 2> wherein, in Formula 2,
* represents a binding site to an adjacent atom, and
Z is hydrogen or a substituted or unsubstituted $C_1$ to $C_{30}$ alkyl group,
wherein a total amount of the photocurable monomer and the silicon-containing monomer in the composition for encapsulation of an organic light emitting diode is in a range of 95 wt% to 99 wt%, and
wherein the photocurable monomer comprises:
   ii) monoalkylene glycol di(meth)acrylate, polyalkylene glycol di(meth)acrylate or a mixture thereof; and
   iii) di(meth)acrylates of $C_2$ to $C_{20}$ diol, triol, tetraol, pentaol or hexaol.

2. The composition for encapsulation of an organic light emitting diode as claimed in claim 1, wherein:
   $R_1$ and $R_2$ are each independently an unsubstituted $C_1$ to $C_5$ alkylene group or a single bond;
   $X_1$, $X_2$, $X_3$, $X_4$, $X_5$ and $X_6$ are each independently a $C_1$ to $C_5$ alkyl group or a $C_6$ to $C_{10}$ aryl group; and
   at least one of $X_1$, $X_2$, $X_3$, $X_4$, $X_5$ and $X_6$ is a $C_6$ to $C_{10}$ aryl group.

3. The composition for encapsulation of an organic light emitting diode as claimed in claim 1, wherein the silicon-containing monomer represented by Formula 1 is represented by one of the following Formulae 3 to 8:

4. The composition for encapsulation of an organic light emitting diode as claimed in claim 1, wherein the silicon-containing monomer has a molecular weight of about 200 g/mol to about 2,000 g/mol.

5. The composition for encapsulation of an organic light emitting diode according to claim 1, wherein the photocurable monomer further comprises i) mono(meth)acrylates of $C_1$ to $C_{30}$ monohydric alcohols;
iv) tri(meth)acrylates of $C_3$ to $C_{20}$ triol, tetraol, pentaol or hexaol; or
v) tetra(meth)acrylate of $C_4$ to $C_{20}$ tetraol, pentaol or hexaol.

6. The composition for encapsulation of an organic light emitting diode according to claim 5, wherein the photocurable monomer further comprises:
v) tetra(meth)acrylates of $C_4$ to $C_{20}$ tetraol, pentaol or hexaol.

7. The composition for encapsulation of an organic light emitting diode as claimed in claim 5, wherein:
the monoalkylene glycol di(meth)acryl ate, the polyalkyleneglycol di(meth)acrylate or the mixture thereof includes at least one of a poly(ethylene glycol) di(meth) acrylate, a diethylene glycol di(meth)acrylate, a triethylene glycol di(meth)acrylate, a tetraethylene glycol di(meth)acrylate, a tri(propylene glycol) di(meth)acrylate, and a poly(propylene glycol) di(meth)acrylate.

8. The composition for encapsulation of an organic light emitting diode according to claim 1, wherein the initiator comprises triazine, acetophenone, benzophenone, thioxanthone, benzoin, phosphorus, oxime initiators, and mixtures thereof.

9. An organic light emitting diode display, comprising:
an organic light emitting diode; and
a barrier stack on the organic light emitting diode, the barrier stack including an inorganic barrier layer and an organic barrier layer,
wherein the organic barrier layer is prepared from the composition for encapsulation of an organic light emitting diode as claimed in claim 1.

10. A composition for encapsulation of an organic light emitting diode, the composition comprising:
a photocurable monomer;
a silicon-containing monomer; and
an initiator,
wherein the silicon-containing monomer is represented by one of the following Formulae 3, 5, and 8:

<Formula 3>

<Formula 5>

<Formula 8> and
wherein the photocurable monomer comprises:
monoalkylene glycol di(meth)acrylate, polyalkylene glycol di(meth)acrylate, or a mixture thereof; and
a di(meth)acrylate of $C_2$ to $C_{20}$ diol, triol, tetraol, pentaol or hexaol.

* * * * *